United States Patent
Sugahara et al.

(10) Patent No.: US 9,120,631 B2
(45) Date of Patent: Sep. 1, 2015

(54) BOARD WORKING SYSTEM, BOARD CONVEYING APPARATUS, AND BOARD WORKING APPARATUS

(71) Applicant: YAMAHA HATSUDOKI KABUSHIKI KAISHA, Shizuoka-ken (JP)

(72) Inventors: Kazuyuki Sugahara, Shizuoka-ken (JP); Toshihiko Ohata, Shizuoka-ken (JP)

(73) Assignee: Yamaha Hatsudoki Kabushiki Kaisha, Shizuoka-ken (JP)

( * ) Notice: Subject to any disclaimer, the term of this patent is extended or adjusted under 35 U.S.C. 154(b) by 88 days.

(21) Appl. No.: 14/080,670

(22) Filed: Nov. 14, 2013

(65) Prior Publication Data

US 2014/0131166 A1    May 15, 2014

(30) Foreign Application Priority Data

Nov. 15, 2012  (JP) .................................. 2012-251390

(51) Int. Cl.
*B65G 21/00* (2006.01)
*B65G 43/08* (2006.01)
*H05K 13/08* (2006.01)
*H05K 13/00* (2006.01)

(52) U.S. Cl.
CPC ............ *B65G 43/08* (2013.01); *H05K 13/0061* (2013.01); *H05K 13/08* (2013.01)

(58) Field of Classification Search
CPC ...... B65G 1/00; B65G 2207/40; H05K 13/04; H05K 3/30; F16P 3/08
USPC ..................................................... 198/860.3
See application file for complete search history.

(56) References Cited

U.S. PATENT DOCUMENTS

| | | | | |
|---|---|---|---|---|
| 5,862,906 | A  * | 1/1999 | Von Wedel | 198/750.1 |
| 7,017,263 | B2 * | 3/2006 | Yanagida | 29/833 |
| 7,562,451 | B2 * | 7/2009 | Ito et al. | 29/890.1 |
| 7,735,632 | B1 * | 6/2010 | Garlow et al. | 198/750.3 |
| 2008/0147232 | A1 * | 6/2008 | Kuribayashi et al. | 29/832 |
| 2010/0268369 | A1 | 10/2010 | Ogata | |
| 2011/0162202 | A1 | 7/2011 | Miyahara et al. | |

FOREIGN PATENT DOCUMENTS

| | | |
|---|---|---|
| GB | 2475204 A | 5/2011 |
| JP | 2005-277212 A | 10/2005 |

(Continued)

OTHER PUBLICATIONS

An Office Action issued by the Korean Patent Office on Nov. 28, 2014, which corresponds to Korean Patent Application No. 10-2013-0138285 and is related to U.S. Appl. No. 14/080,670.

(Continued)

*Primary Examiner* — James R Bidwell
(74) *Attorney, Agent, or Firm* — Studebaker & Brackett PC

(57) ABSTRACT

A board working system includes a board working apparatus working on a board and a board conveying apparatus including a first board conveying portion, connected to the board working apparatus. The board conveying apparatus is provided with a shutter device closing such that the maximum interval of an opening gap leading from the first board conveying portion to the board working apparatus is not more than a prescribed value when setup for the first board conveying portion is performed.

15 Claims, 6 Drawing Sheets

(56) References Cited

FOREIGN PATENT DOCUMENTS

| JP | 2010-062340 A | 3/2010 |
|---|---|---|
| JP | 2010-251450 A | 11/2010 |
| JP | 2011-131488 A | 7/2011 |
| KR | 2011-0066136 A | 6/2011 |
| WO | 2012/133441 A1 | 10/2012 |

OTHER PUBLICATIONS

The extended European search report issued by the European Patent Office on Mar. 13, 2015, which corresponds to European Patent Application No. 13005350.7—1803 and is related to U.S. Appl. No. 14/080,670.

* cited by examiner

BOARD WORKING SYSTEM, BOARD CONVEYING APPARATUS, AND BOARD WORKING APPARATUS

CROSS-REFERENCE TO RELATED APPLICATION

The priority application number JP2012-251390, Board Working System, Board Conveying Apparatus, and Board Working Apparatus, Nov. 15, 2012, Kazuyuki Sugahara and Toshihiko Ohata, upon which this patent application is based is hereby incorporated by reference in its entirety.

BACKGROUND OF THE DISCLOSURE

1. Field of the Disclosure

The present disclosure relates to a board working system, a board conveying apparatus, and a board working apparatus.

2. Description of the Background Art

A board working apparatus working on a board is known in general. Such a board working apparatus is disclosed in Japanese Patent Laying-Open No. 2010-251450, for example.

The aforementioned Japanese Patent Laying-open No. 2010-251450 discloses a component mounting apparatus (board working apparatus) mounting a component (working) on a board. This component mounting apparatus includes two working apparatuses each including a board conveyance path, a cover member covering the two working apparatuses, and a partition member detachably provided between the two working apparatuses to separate each other's work space. In this component mounting apparatus, boards are delivered from the two board conveyance paths to an external apparatus (board conveying apparatus) through openings provided in the cover member.

According to the aforementioned Japanese Patent Laying-open No. 2010-251450, however, in the case where the board conveyance paths of the component mounting apparatus are connected to board conveying portions of the board conveying apparatus, the component mounting apparatus is accessible to the board conveying apparatus through the openings for delivering the boards, so that extraneous material, such as a tool, may disadvantageously enter the component mounting apparatus when setup for a board conveying portion of the board conveying apparatus is performed.

SUMMARY OF THE DISCLOSURE

The present disclosure has been proposed in order to solve the aforementioned problem, and an object of the present disclosure is to provide a board working system, a board conveying apparatus, and a board working apparatus each capable of preventing the entry of extraneous material into the board working apparatus from a board conveying portion of the board conveying apparatus through an opening when setup for the board conveying portion of the board conveying apparatus is performed.

In order to attain the aforementioned object, a board working system according to a first aspect of the present disclosure includes a board working apparatus working on a board and a board conveying apparatus including a first board conveying portion conveying the board in a prescribed direction, a second board conveying portion arranged adjacent to the first board conveying portion in a direction orthogonal to the prescribed direction, conveying the board, and a cover member covering the first board conveying portion and the second board conveying portion and connected to the board working apparatus, while at least one of the board working apparatus and the board conveying apparatus is provided with a shutter device closing such that the maximum interval of an opening gap leading from the first board conveying portion to the board working apparatus is not more than a prescribed value when setup for the first board conveying portion is performed.

In the board working system according to the first aspect of the present disclosure, as hereinabove described, at least one of the board working apparatus and the board conveying apparatus is provided with the shutter device closing such that the maximum interval of the opening gap leading from the first board conveying portion of the board conveying apparatus to the board working apparatus is not more than the prescribed value when the setup for the first board conveying portion is performed, whereby the shutter device can prevent the entry of extraneous material into the board working apparatus from the first board conveying portion of the board conveying apparatus through an opening when the setup for the first board conveying portion of the board conveying apparatus is performed. Thus, the operation of the board working apparatus may not be stopped when the setup for the board conveying portion of the board conveying apparatus is performed, and hence a reduction in the efficiency of work on the board can be suppressed.

In the aforementioned board working system according to the first aspect, the shutter device is preferably provided in the board conveying apparatus and is preferably configured to close such that the maximum interval of the opening gap leading from the first board conveying portion to the board working apparatus is not more than the prescribed value when the setup for the first board conveying portion is performed. According to this structure, the shutter device provided in the board conveying apparatus can prevent the entry of extraneous material into the board working apparatus from the first board conveying portion of the board conveying apparatus through the opening when the setup for the first board conveying portion of the board conveying apparatus is performed.

In the aforementioned board working system according to the first aspect, the board working apparatus or the board conveying apparatus provided with the shutter device preferably further includes a shutter opening/closing detection portion detecting opening/closing of the shutter device. According to this structure, closing of the shutter device can be reliably detected by the shutter opening/closing detection portion when the setup for the first board conveying portion is performed.

The aforementioned board working system according to the first aspect preferably further includes a controller controlling the board working apparatus and the board conveying apparatus, the cover member of the board conveying apparatus preferably includes an opening and closing door opened when the setup for the first board conveying portion is performed, and the controller is preferably configured to perform control of stopping at least one of the board working apparatus and the board conveying apparatus when the shutter device is opened in a state where the opening and closing door is opened. According to this structure, at least one of the board working apparatus and the board conveying apparatus is stopped when the shutter device remains open despite the fact that the opening and closing door is opened, and hence damage of the board working apparatus or the board conveying apparatus can be suppressed even in the case where extraneous material enters one of the board conveying apparatus and the board working apparatus from the other of the board conveying apparatus and the board working apparatus through the opening.

In the aforementioned structure including the controller, the board conveying apparatus preferably further includes a door opening/closing detection portion detecting opening/closing of the opening and closing door. According to this structure, opening of the opening and closing door can be reliably detected when the opening and closing door is opened in the state where the shutter device remains open, and hence at least one of the board working apparatus and the board conveying apparatus can be reliably stopped.

In the aforementioned structure including the controller, the controller is preferably configured to perform control of stopping at least one of the board working apparatus and the board conveying apparatus by controlling power supplied to the board working apparatus and the board conveying apparatus when the shutter device is opened in the state where the opening and closing door is opened. According to this structure, power supplied to at least one of the board working apparatus and the board conveying apparatus is stopped when the shutter device is opened in the state where the opening and closing door is opened, and hence the operation of the board working apparatus or the board conveying apparatus can be reliably stopped.

In the aforementioned board working system according to the first aspect, the board working apparatus preferably includes a third board conveying portion conveying the board in the prescribed direction and a fourth board conveying portion arranged adjacent to the third board conveying portion in the direction orthogonal to the prescribed direction, conveying the board, the third board conveying portion is preferably configured to deliver the board to the first board conveying portion through the shutter device and deliver the board to the second board conveying portion through a site different from the shutter device, and the shutter device is preferably configured to close such that the maximum interval of an opening gap leading from the first board conveying portion to the third board conveying portion of the board working apparatus is not more than the prescribed value when the setup for the first board conveying portion is performed. According to this structure, the third board conveying portion of the board working apparatus can deliver the board to the second board conveying portion of the board conveying apparatus even when the shutter device is closed, and hence the third and fourth board conveying portions can continuously operate while the entry of extraneous material into the third board conveying portion from the first board conveying portion is prevented even during the setup for the first board conveying portion of the board conveying apparatus. Consequently, a reduction in the efficiency of work on the board can be effectively suppressed.

In this case, the second board conveying portion is preferably configured to receive the board from each of the third board conveying portion and the fourth board conveying portion through a site different from the shutter device when the setup for the first board conveying portion is performed. According to this structure, the second board conveying portion can receive the board from each of the third board conveying portion and the fourth board conveying portion through the site different from the shutter device when the setup for the first board conveying portion is performed, and hence a reduction in the efficiency of work on the board can be more easily suppressed.

In the aforementioned board working system according to the first aspect, the board conveying apparatus is preferably configured such that the maximum interval of an opening gap leading from the first board conveying portion to the second board conveying portion is not more than a prescribed value when the setup for the first board conveying portion is performed. According to this structure, the entry of extraneous material into the second board conveying portion from the first board conveying portion can be prevented when the setup for the first board conveying portion is performed, and hence the operation of the second board conveying portion may not be stopped. Consequently, a reduction in the efficiency of conveyance work of the board performed by the second board conveying portion can be suppressed.

In this case, the board conveying apparatus preferably further includes a partition member provided on the side of the first board conveying portion closer to the second board conveying portion such that the maximum interval of the opening gap leading from the first board conveying portion to the second board conveying portion is not more than the prescribed value. According to this structure, the maximum interval of the opening gap leading from the first board conveying portion to the second board conveying portion can be easily set to not more than the prescribed value with the partition member.

A board conveying apparatus according to a second aspect of the present disclosure is connected to a board working apparatus working on a board and includes a first board conveying portion conveying the board in a prescribed direction, a second board conveying portion arranged adjacent to the first board conveying portion in a direction orthogonal to the prescribed direction, a cover member covering the first board conveying portion and the second board conveying portion, and a shutter device closing such that the maximum interval of an opening gap leading from the first board conveying portion to the board working apparatus is not more than a prescribed value when setup for the first board conveying portion is performed.

As hereinabove described, the board conveying apparatus according to a second aspect of the present disclosure is provided with the shutter device closing such that the maximum interval of the opening gap leading from the first board conveying portion of the board conveying apparatus to the board working apparatus is not more than the prescribed value when the setup for the first board conveying portion is performed, whereby the board conveying apparatus capable of preventing the entry of extraneous material into the board working apparatus from the first board conveying portion of the board conveying apparatus through an opening by the shutter device when the setup for the first board conveying portion of the board conveying apparatus is performed can be provided. Thus, the operation of the board working apparatus may not be stopped when the setup for the board conveying portion of the board conveying apparatus is performed, and hence a reduction in the efficiency of work on the board can be suppressed.

In the aforementioned board conveying apparatus according to the second aspect, the board working apparatus preferably includes a third board conveying portion conveying the board in the prescribed direction and a fourth board conveying portion arranged adjacent to the third board conveying portion in the direction orthogonal to the prescribed direction, conveying the board, the second board conveying portion is preferably configured to receive the board from the fourth board conveying portion through a site different from the shutter device, and the shutter device is preferably configured to close such that the maximum interval of an opening gap leading from the first board conveying portion to the third board conveying portion of the board working apparatus is not more than the prescribed value when the setup for the first board conveying portion is performed. According to this structure, the second board conveying portion can receive the board from the fourth board conveying portion through the site different from the shutter device when the setup for the first board conveying portion is performed, and hence a reduction in the efficiency of work on the board can be easily suppressed.

In this case, the second board conveying portion is preferably configured to receive the board from the third board conveying portion in addition to the fourth board conveying portion through a site different from the shutter device when the setup for the first board conveying portion is performed. According to this structure, the second board conveying portion can receive the board from each of the third board conveying portion and the fourth board conveying portion through the site different from the shutter device when the setup for the first board conveying portion is performed, and hence a reduction in the efficiency of work on the board can be more easily suppressed.

The aforementioned board conveying apparatus according to the second aspect is preferably configured such that the maximum interval of an opening gap leading from the first board conveying portion to the second board conveying portion is not more than a prescribed value when the setup for the first board conveying portion is performed. According to this structure, the entry of extraneous material into the second board conveying portion from the first board conveying portion can be prevented when the setup for the first board conveying portion is performed, and hence the operation of the second board conveying portion may not be stopped. Consequently, a reduction in the efficiency of conveyance work of the board performed by the second board conveying portion can be suppressed.

A board working apparatus according to a third aspect of the present disclosure works on a board and includes a board working portion connected to a board conveying apparatus including a first board conveying portion conveying the board in a prescribed direction, a second board conveying portion arranged adjacent to the first board conveying portion in a direction orthogonal to the prescribed direction, conveying the board, and a cover member covering the first board conveying portion and the second board conveying portion and a shutter device closing such that the maximum interval of an opening gap leading from the first board conveying portion of the board conveying apparatus to the board working portion is not more than a prescribed value when setup for the first board conveying portion is performed.

As hereinabove described, the board working apparatus according to the third aspect of the present disclosure is provided with the shutter device closing such that the maximum interval of the opening gap leading from the first board conveying portion of the board conveying apparatus to the board working portion is not more than the prescribed value when the setup for the first board conveying portion of the board conveying apparatus is performed, whereby the board working apparatus capable of preventing the entry of extraneous material from the first board conveying portion of the board conveying apparatus through an opening by the shutter device when the setup for the first board conveying portion of the board conveying apparatus is performed can be provided. Thus, the operation of the board working apparatus may not be stopped when the setup for the board conveying portion of the board conveying apparatus is performed, and hence a reduction in the efficiency of work on the board can be suppressed.

According to the present disclosure, as hereinabove described, the entry of extraneous material into the board working apparatus from the first board conveying portion of the board conveying apparatus through the opening can be prevented when the setup for the first board conveying portion of the board conveying apparatus is performed.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

An embodiment of the present disclosure is hereinafter described with reference to the drawings.

The structure of a board working system 100 according to the embodiment of the present disclosure is now described with reference to FIGS. 1 to 7.

Figure 1:
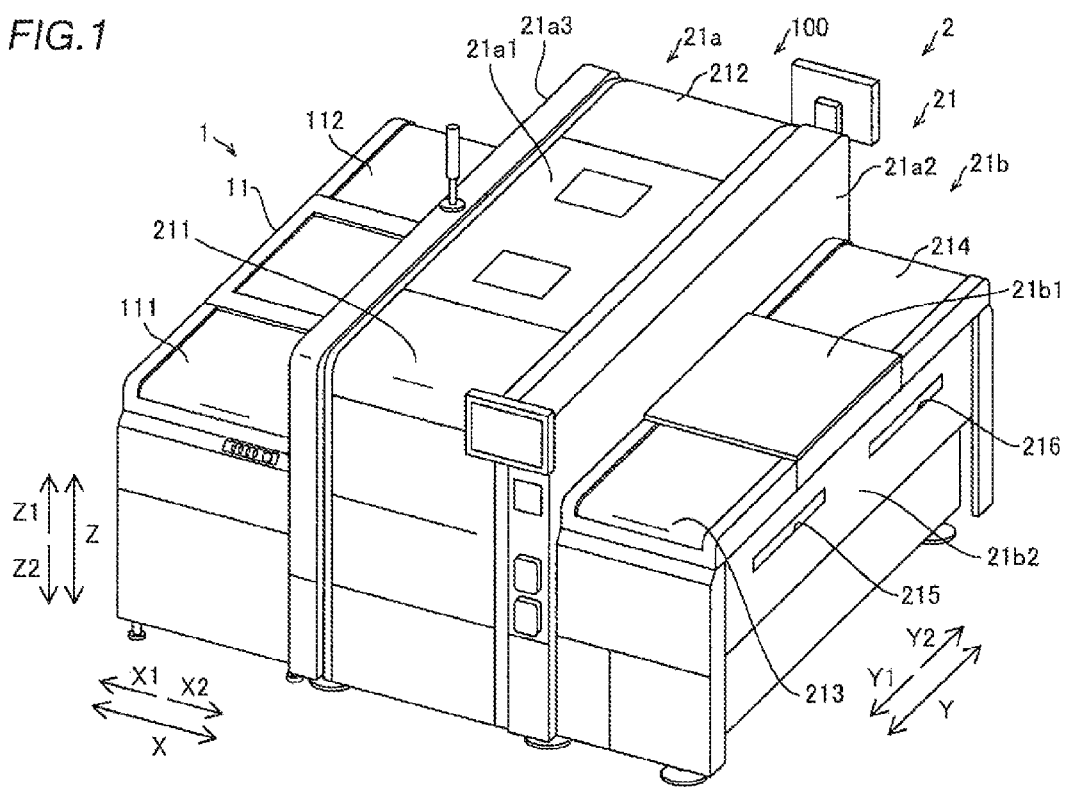
FIG. 1 is a perspective view showing a board working system according to an embodiment of the present disclosure.

The board working system 100 according to the embodiment of the present disclosure includes a buffer conveyor 1 capable of conveying a board 3 downstream and a printing machine 2, as shown in FIG. 1. The board working system 100 has two lanes and is configured to be capable of concurrently working on a plurality of boards 3. The buffer conveyor 1 is an example of the "board conveying apparatus" in the present disclosure, and the printing machine 2 is an example of the "board working apparatus" in the present disclosure.

The buffer conveyor 1 is a board conveying apparatus capable of shifting the position of the board 3 received from the upstream side to convey the board 3 downstream. In this board working system 100, the buffer conveyor 1 is arranged on the downstream side (X1 side) of the printing machine 2 in a conveyance direction. The buffer conveyor 1 is configured to receive the board 3 from the printing machine 2 on the upstream side (X2 side) in the conveyance direction and deliver the board 3 to an apparatus 4 (see FIG. 5) on the downstream side (X1 side) in the conveyance direction. The buffer conveyor 1 is a dual-conveyance board conveying apparatus. The buffer conveyor 1 includes a base 10, a cover member 11 (see FIG. 2), two board conveying portions 12 and 13, and a pair of rails 14, as shown in FIG. 3. The board conveying portion 12 is an example of the "first board conveying portion" in the present disclosure, and the board conveying portion 13 is an example of the "second board conveying portion" in the present disclosure.

Figure 4:
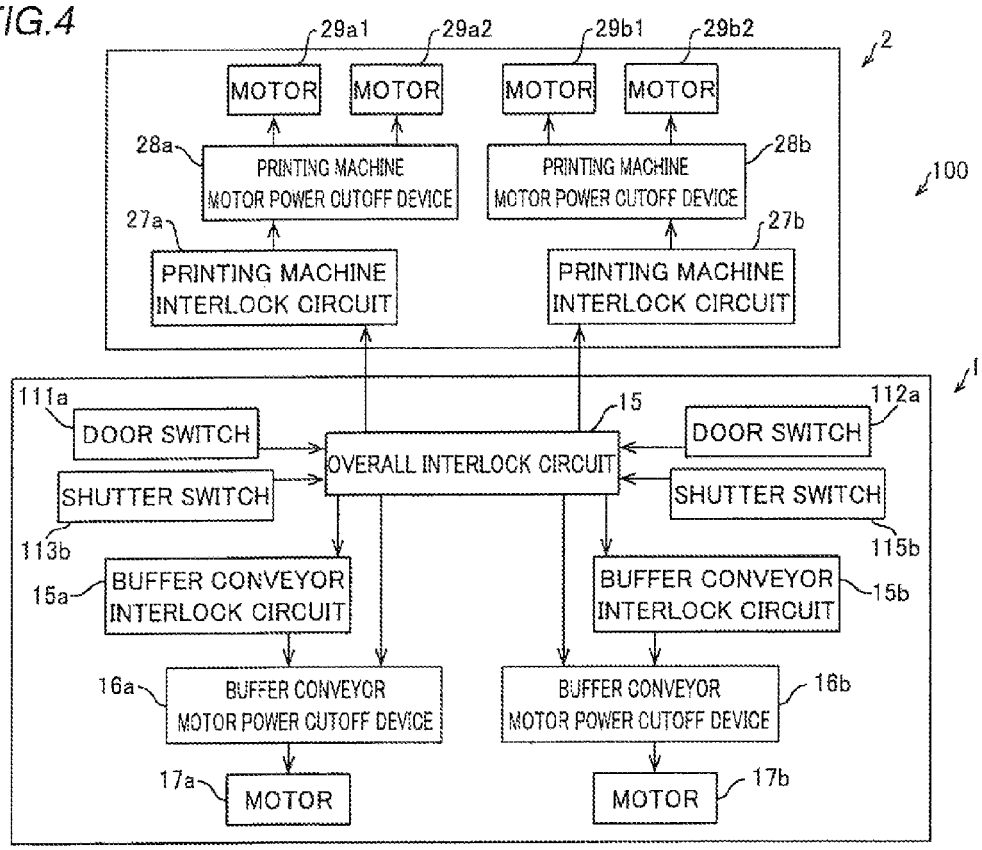
FIG. 4 is a block diagram showing the control structure of the board working system according to the embodiment of the present disclosure.

As shown in FIG. 4, the buffer conveyor 1 includes an overall interlock circuit 15, buffer conveyor interlock circuits 15a and 15b, buffer conveyor motor power cutoff devices 16a and 16b, motors 17a and 17b, door switches 111a and 112a, and shutter switches 113b and 115b as control structure. The buffer conveyor interlock circuit 15a, the buffer conveyor motor power cutoff device 16a, the motor 17a, the door switch 111a, and the shutter switch 113b correspond to the side of the board conveying portion 12. The buffer conveyor interlock circuit 15b, the buffer conveyor motor power cutoff device 16b, the motor 17b, the door switch 112a, and the shutter switch 115b correspond to the side of the board conveying portion 13. The overall interlock circuit 15 is an example of the "controller" in the present disclosure. The door switches 111a and 112a are examples of the "door opening/closing detection portion" in the present disclosure, and the shutter switches 113b and 115b are examples of the "shutter opening/closing detection portion" in the present disclosure.

Figure 2:
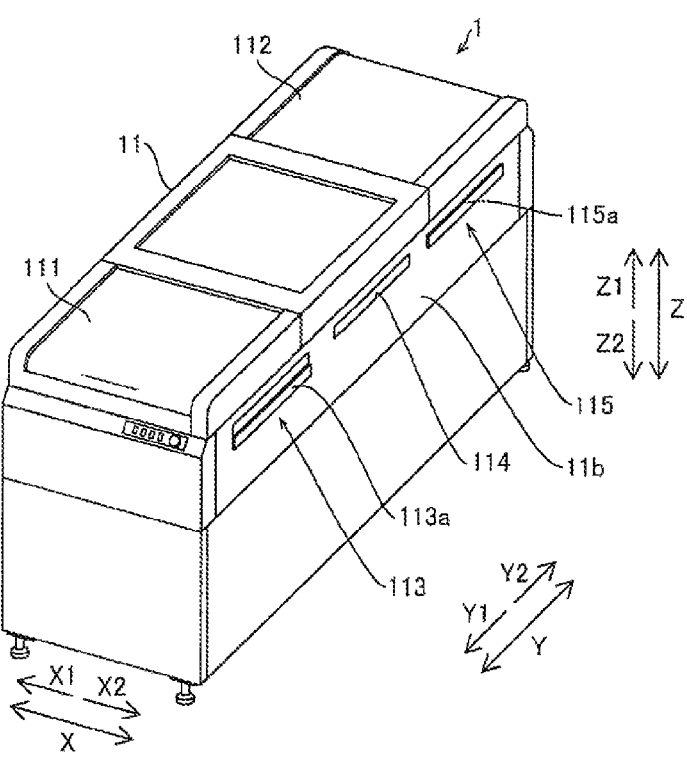
FIG. 2 is a perspective view showing a buffer conveyor of the board working system according to the embodiment of the present disclosure.
Figure 3:
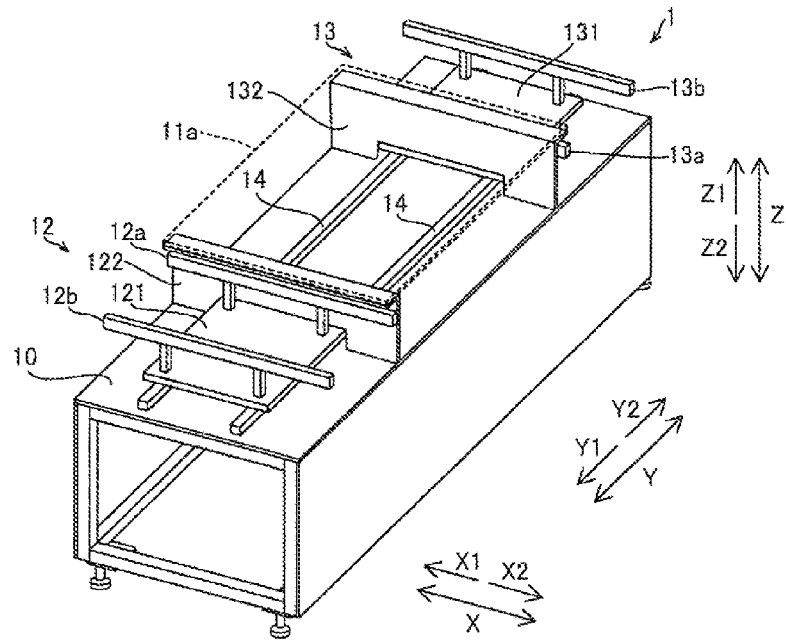
FIG. 3 is a perspective view showing an internal portion of the buffer conveyor of the board working system according to the embodiment of the present disclosure.
Figure 6:
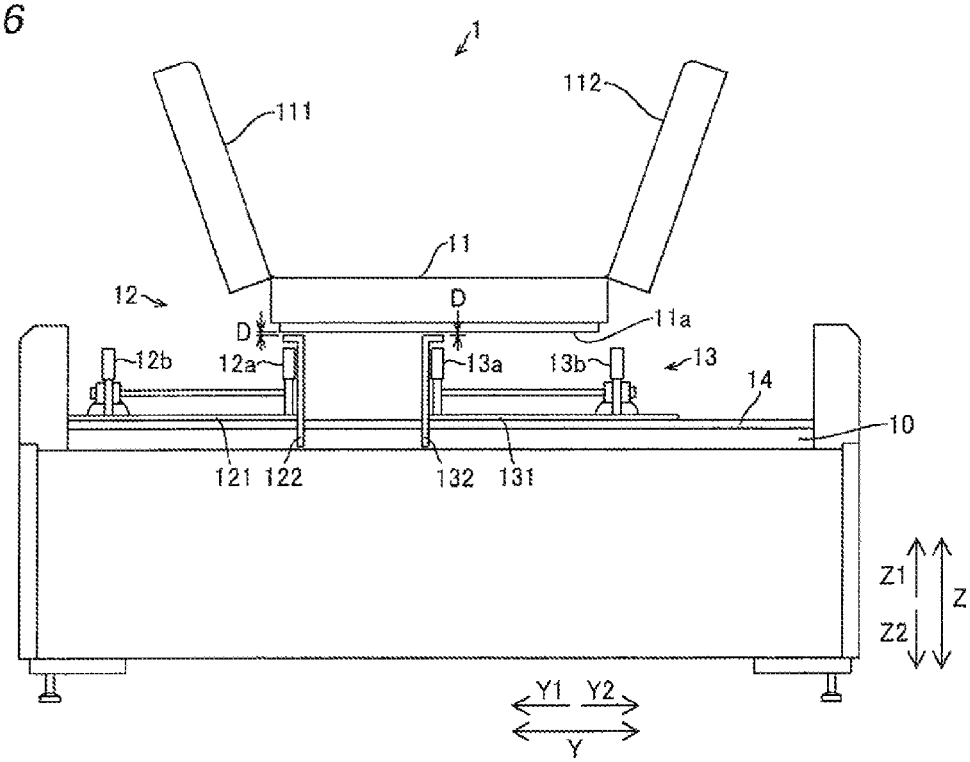
FIG. 6 is a side elevational view showing the internal portion of the buffer conveyor of the board working system according to the embodiment of the present disclosure.
Figure 7:
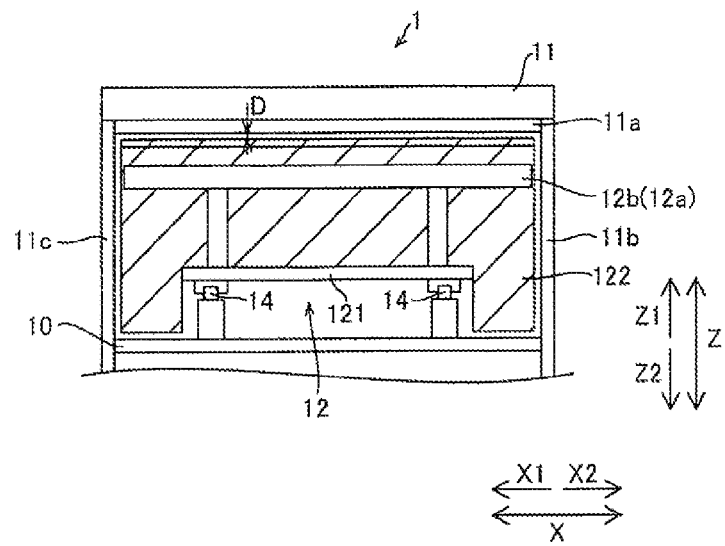
FIG. 7 is a front elevational view showing the internal portion of the buffer conveyor of the board working system according to the embodiment of the present disclosure.

The cover member 11 is arranged on an upper portion of the buffer conveyor 1 and is configured to cover the board conveying portions 12 and 13, as shown in FIGS. 1 and 2. In other words, the cover member 11 is provided not to expose the board conveying portions 12 and 13. The cover member 11 includes an upper cover 11a, a side cover 11b, a side cover 11c (see FIG. 7), and opening and closing doors 111 and 112. The opening and closing door 111 (112) is arranged on the upper side (Z1 side) of the board conveying portion 12 (13) and is opened when setup for the board conveying portion 12 (13) is performed, as shown in FIG. 6. During the setup for the board conveying portion 12 (13), the conveyed board 3 is checked, and the board 3 is extracted. The opening and closing door 111 (112) is configured to press the door switch 111a (112a) (see FIG. 4) when the opening and closing door 111 (112) is closed. In other words, opening/closing of the opening and closing door 111 (112) is detected by the door switch 111a (112a).

Figure 5:
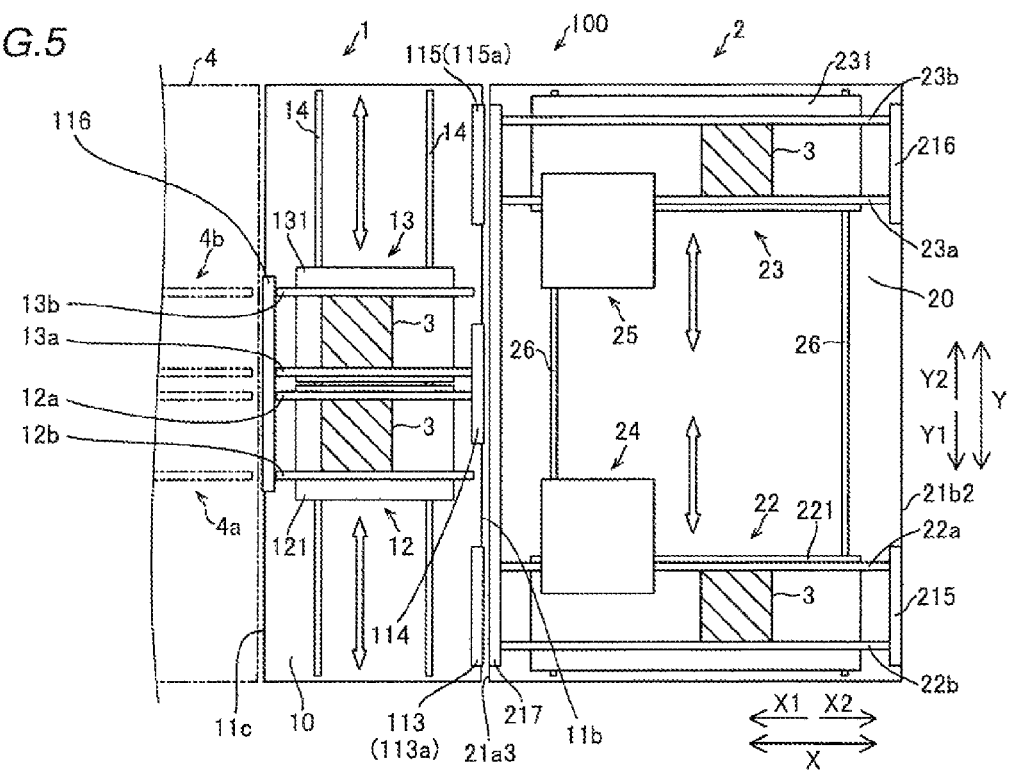
FIG. 5 is a plan view showing a board conveying portion of the buffer conveyor and a board conveying portion of a printing machine of the board working system according to the embodiment of the present disclosure.

As shown in FIGS. 2 and 5, the side cover 11b on the upstream side (X2 side) of the cover member 11 in the conveyance direction is formed with carry-in ports 113, 114, and 115. The carry-in port 113 is arranged on the side of the board conveying portion 12 (Y1 side), and the carry-in port 115 is arranged on the side of the board conveying portion 13 (Y2 side). The carry-in port 114 is arranged in a substantially central portion of the side cover 11b in a direction Y. The board 3 carried in from the carry-in port 113 is delivered to the board conveying portion 12, and the board 3 carried in from the carry-in port 115 is delivered to the board conveying portion 13. The board 3 carried in from the carry-in port 114 is delivered to either the board conveying portion 12 or 13.

According to this embodiment, the carry-in ports 113 and 115 are provided with shutter devices 113a and 115a capable of opening and closing the carry-in ports 113 and 115, respectively, as shown in FIG. 2. In the case of an example shown in FIG. 2, the shutter device 113a is in an open state, and the shutter device 115a is in a closed state. The shutter device 113a (115a) is configured to be opened to carry the board 3 in during the operation of the board conveying portion 12 (13). Furthermore, the shutter device 113a (115a) is configured to close such that there is no opening gap (the opening gap is 0 mm) in the carry-in port 113 (115) at the time of stoppage for the setup for the board conveying portion 12 (13). The shutter device 113a (115a) is configured to press the shutter switch 113b (115b) (see FIG. 4) when the shutter device 113a (115a) is closed. In other words, opening/closing of the shutter device 113a (115a) is detected by the shutter switch 113b (115b).

As shown in FIG. 5, the side cover 11c of the cover member 11 on the downstream side (X1 side) in the conveyance direction is formed with a carry-out port 116 in a substantially central portion in the direction Y. The boards 3 conveyed by the board conveying portions 12 and 13 are carried out through the carry-out port 116.

The board conveying portion 12 is arranged adjacent to the Y1 side of the board conveying portion 13. The board conveying portion 12 is configured to be movable in a direction (direction Y) orthogonal to the conveyance direction (direction X (prescribed direction in the present disclosure)) of the board 3 along the pair of rails 14, as shown in FIG. 5. Specifically, the board conveying portion 12 is configured to be moved in the direction Y by driving of the motor 17a (see FIG. 4). Furthermore, the board conveying portion 12 is configured to receive the board 3 through the carry-in port 113 from a board conveying portion 22 of the printing machine 2 on the upstream side (X2 side) in the conveyance direction, as shown in FIG. 5. The board conveying portion 12 is configured to move the received board 3 along arrow Y2 and deliver the board 3 to a front lane 4a or a rear lane 4b of the apparatus 4 on the downstream side (X1 side) in the conveyance direction through the carry-out port 116. In the buffer conveyor 1 according to this embodiment, the board conveying portion 12 can be displaced along arrow Y2 and moved into the board conveying portion 13. Specifically, the board conveying portion 12 is configured to be capable of receiving the board 3 through the carry-in port 114 from a board conveying portion 23 of the printing machine 2 on the upstream side (X2 side) in the conveyance direction, being moved in the direction Y, and delivering the board 3 to the front lane 4a or the rear lane 4b of the apparatus 4 on the downstream side (X1 side) in the conveyance direction through the carry-out port 116. Furthermore, the board conveying portion 12 is configured to be independently movable in the direction Y without interfering with the board conveying portion 13.

The board conveying portion 12 includes a plate 121 configured to be moved in the direction Y along the rails 14 by driving of the motor 17a, a pair of conveyors 12a and 12b fixed to the upper surface of the plate 121 through supports, conveying the board 3 along arrow X1, and a back cover 122 fixed to the upper surface of the plate 121, as shown in FIG. 3. The conveyor 12a on a side (Y2 side) closer to the board conveying portion 13 is fixedly set on the plate 121. On the other hand, the conveyor 12b on an opposite side (Y1 side) to the board conveying portion 13 is set on the plate 121 to be movable in the direction Y. Thus, the width of the pair of conveyors 12a and 12b in the direction Y can be adjusted according to the length of the board 3 in the direction Y. The conveyor 12a closer to the center of the buffer conveyor 1 in the direction Y is fixed, whereby the amount of movement of the board conveying portion 12 in the direction Y can be reduced. Consequently, the conveyance cycle time of the board 3 can be reduced. The back cover 122 is an example of the "partition member" in the present disclosure.

The plate 121 is movably arranged on the pair of rails 14, as shown in FIG. 3. The back cover 122 is arranged on the side (Y2 side) of the plate 121 closer to the board conveying portion 13 in the direction Y. In other words, the back cover 122 is formed such that the maximum interval D (see FIGS. 6 and 7) of an opening gap leading from the board conveying portion 12 to the board conveying portion 13 is not more than a prescribed value (6 mm, for example). Specifically, the buffer conveyor 1 is configured such that the maximum interval D of the opening gap between the back cover 122 and the upper cover 11a of the cover member 11 is not more than the prescribed value when the setup for the board conveying portion 12 is performed. Furthermore, the buffer conveyor 1 is configured such that the maximum intervals D of opening gaps between the back cover 122 and the side cover 11b of the cover member 11, the back cover 122 and the side cover 11c of the cover member 11, and the back cover 122 and the base 10 are not more than prescribed values.

The board conveying portion 13 is arranged adjacent to the Y2 side of the board conveying portion 12. The board conveying portion 13 is similar in structure to the board conveying portion 12, and hence the description is omitted. Conveyors 13a and 13b of the board conveying portion 13 correspond to the conveyors 12a and 12b of the board conveying portion 12, respectively. A plate 131 and a back cover 132 of the board conveying portion 13 correspond to the plate 121 and the back cover 122 of the board conveying portion 12, respectively. The back cover 132 is arranged on the side (Y1 side) of the plate 131 closer to the board conveying portion 12, i.e. closer to the center, in the direction Y. The conveyor 13a on a side (Y1 side) closer to the board conveying portion 12, i.e. closer to the center is fixedly set on the plate 131. On the other hand, the conveyor 13b on an opposite side (Y2 side) to the board conveying portion 12 is set on the plate 131 to be movable in the direction Y. The back cover 132 is an example of the "partition member" in the present disclosure.

The back cover 132 is also similar in structure to the back cover 122. In other words, the buffer conveyor 1 is configured such that the maximum interval D of an opening gap between the back cover 132 and the upper cover 11a of the cover member 11 is not more than the prescribed value when the setup for the board conveying portion 13 is performed. Furthermore, the buffer conveyor 1 is configured such that the maximum intervals D of opening gaps between the back cover 132 and the side cover 11b of the cover member 11, the back cover 132 and the side cover 11c of the cover member 11, and the back cover 132 and the base 10 are not more than the prescribed values.

The overall interlock circuit 15 (see FIG. 4) is configured to control power supply to the buffer conveyor 1 and the printing machine 2. Specifically, the overall interlock circuit 15 is configured to perform control of turning on/off driving of the motor 17a of the board conveying portion 12 of the buffer conveyor 1 through the buffer conveyor interlock circuit 15a and the buffer conveyor motor power cutoff device 16a. The overall interlock circuit 15 is configured to perform control of turning on/off driving of the motor 17b of the board conveying portion 13 of the buffer conveyor 1 through the buffer conveyor interlock circuit 15b and the buffer conveyor motor power cutoff device 16b. Furthermore, the overall interlock circuit 15 is configured to perform control of turning on/off power supply to a motor 29a1 (for driving the conveyor to move the board 3 on the conveyor along arrow X1) and a motor 29a2 (for moving the board conveying portion 22 in the direction Y) of the board conveying portion 22 of the printing machine 2 and motors for moving a squeegee of an unshown squeegee device up and down and moving printing of the squeegee through a printing machine interlock circuit 27a and a printing machine motor power cutoff device 28a. The overall interlock circuit 15 is configured to perform control of turning on/off power supply to a motor 29b1 (for driving the conveyor to move the board 3 on the conveyor along arrow X1) and a motor 29b2 (for moving the board conveying portion 23 in the direction Y) of the board conveying portion 23 of the printing machine 2 and motors for moving a squeegee of an unshown squeegee device up and down and moving printing of the squeegee through a printing machine interlock circuit 27b and a printing machine motor power cutoff device 28b.

The overall interlock circuit 15 is configured to perform control of stopping (turning off servos of) at least one of the buffer conveyor 1 and the printing machine 2 when the shutter device 113a or 115a is opened in a state where the opening and closing door 111 or 112 of the buffer conveyor 1 is opened. In other words, the overall interlock circuit 15 is configured to perform control of turning on/off the servos related to traveling and board conveyance of the board conveying portions 12 and 13 of the buffer conveyor 1 and the squeegee devices of the printing machine 2 on the basis of detection results of the door switches 111a and 112a and the shutter switches 113b and 115b. The overall interlock circuit 15 is configured to perform control of stopping at least one of the buffer conveyor 1 and the printing machine 2 by controlling power supplied to the buffer conveyor 1 and the printing machine 2 when the shutter device 113a or 115a is opened in the state where the opening and closing door 111 or 112 is opened.

The printing machine 2 is configured to work on the boards 3. Specifically, the printing machine 2 is configured to mask-print solder paste on the upper surfaces of the boards 3. The printing machine 2 is a dual-conveyance printing machine. The printing machine 2 is connected to the upstream side (X2 side) of the buffer conveyor 1 in the conveyance direction. The printing machine 2 includes a cover member 21, as shown in FIG. 1. The printing machine 2 further includes the two board conveying portions 22 and 23 arranged on a base 20 and two printing operation portions 24 and 25, as a board working portion, as shown in FIG. 5. The printing operation portions 24 and 25 each are provided with a screen mask and the squeegee device (not shown). Thus, two boards 3 can be concurrently conveyed, and mask-printing can be concurrently performed on the two boards 3. In addition, mask-printing can be sequentially performed on one board 3 by the two printing operation portions. The board conveying portion 22 is an example of the "third board conveying portion" in the present disclosure, and the board conveying portion 23 is an example of the "fourth board conveying portion" in the present disclosure.

As shown in FIG. 4, the printing machine 2 includes the printing machine interlock circuits 27a and 27b, the printing machine motor power cutoff devices 28a and 28b, the motors 29a1, 29a2, 29b1, and 29b2, and other motors (not shown) as control structure. The printing machine interlock circuit 27a, the printing machine motor power cutoff device 28a, and the motors 29a1 and 29a2 correspond to the side of the board conveying portion 22. The printing machine interlock circuit 27b, the printing machine motor power cutoff device 28b, and the motors 29b1 and 29b2 correspond to the side of the board conveying portion 23.

The cover member 21 is arranged on an upper portion of the printing machine 2 and is configured to cover the board conveying portions 22 and 23 and the printing operation portions 24 and 25, as shown in FIG. 1. In other words, the cover member 21 is constituted by a downstream cover member 21a provided not to expose the printing operation portions 24 and 25 and the X1 side of the board working portion and an upstream cover member 21b provided not to expose the printing operation portions 24 and 25 and the X2 side of the board working portion. The downstream cover member 21a includes opening and closing doors 211 and 212, a downstream upper cover 21a1, a side cover 21a2 on the X2 side, and a side cover 21a3 on the X1 side. The upstream cover member 21b includes opening and closing doors 213 and 214, an upstream upper cover 21b1, and a side cover 21b2 on the X2 side. The opening and closing door 211 (212) is arranged on the upper side (Z1 side) of the printing operation portion 24 (25) and is configured to be opened when setup for the printing operation portion 24 (25) is performed. The opening and closing door 213 (214) is arranged on the X2 side of the opening and closing door 211 (212) and is configured to be opened when setup for the board conveying portion 22 (23) is performed. During the setup for the board conveying portion 22 (23), a backup pin (not shown) or the like is replaced.

As shown in FIGS. 1 and 5, the side cover 21b2 of the upstream cover member 21b on the upstream side (X2 side) of the cover member 21 in the conveyance direction is formed with carry-in ports 215 and 216. The carry-in port 215 is arranged on the side of the board conveying portion 22 (Y1 side), and the carry-in port 216 is arranged on the side of the board conveying portion 23 (Y2 side). The board 3 carried in through the carry-in port 215, on which the printing machine 2 has not yet worked, is delivered to the board conveying portion 22, and the board 3 carried in through the carry-in port 216, on which the printing machine 2 has not yet worked, is delivered to the board conveying portion 23.

The side cover 21a3 of the downstream cover member 21a on the downstream side (X1 side) of the cover member 21 in the conveyance direction is formed with a carry-out port 217. The boards 3 conveyed by the board conveying portions 22 and 23, on which the printing machine 2 has worked, are carried out through the carry-out port 217. The carry-out port 217 is arranged to be opposed to the carry-in ports 113 to 115 of the buffer conveyor 1.

The board conveying portion 22 is arranged adjacent to the Y1 side of the board conveying portion 23. The board conveying portion 22 is configured to be movable in the direction (direction Y) orthogonal to the conveyance direction (direction X) of the board 3 along a pair of rails 26, as shown in FIG. 5. Specifically, the board conveying portion 22 is configured to be moved in the direction Y by driving of the motor 29a2 (see FIG. 4). The board conveying portion 22 is configured to deliver the board 3 on which printing has been performed to the board conveying portion 12 or 13 of the buffer conveyor 1 on the downstream side (X1 side) in the conveyance direction through the carry-out port 217. In the printing machine 2 according to this embodiment, the board conveying portion 22 can be displaced along arrow Y2 and moved into a central portion of the base 20. Furthermore, the board conveying portion 22 is configured to be independently movable in the direction Y without interfering with the board conveying portion 23.

The board conveying portion 22 includes a pair of conveyors 22a and 22b conveying the board 3 along arrow X1 and a plate 221 configured to be movable in the direction Y along the pair of rails 26, as shown in FIG. 5. The conveyor 22a on a side (Y2 side) closer to the board conveying portion 23 is fixedly set on the plate 221. On the other hand, the conveyor 22b on an opposite side (Y1 side) to the board conveying portion 23 is set on the plate 221 to be movable in the direction Y. Thus, the width of the pair of conveyors 22a and 22b in the direction Y can be adjusted according to the length of the board 3 in the direction Y. The conveyor 22a closer to the center of the printing machine 2 in the direction Y is fixed, whereby the amount of movement of the board conveying portion 22 in the direction Y can be reduced. Consequently, the conveyance cycle time of the board 3 can be reduced.

The board conveying portion 23 is arranged adjacent to the Y2 side of the board conveying portion 22. The board conveying portion 23 is similar in structure to the board conveying portion 22, and hence the description is omitted. Conveyors 23a and 23b of the board conveying portion 23 correspond to the conveyors 22a and 22b of the board conveying portion 22, respectively. A plate 231 of the board conveying portion 23 corresponds to the plate 221 of the board conveying portion 22.

The printing operation portion 24 is arranged adjacent to the Y1 side of the printing operation portion 25. The printing operation portion 24 is configured to be movable in the direction Y. Thus, the printing operation portion 24 and the printing operation portion 25 can work (perform mask-printing) on the board 3 conveyed by the board conveying portion 22 and the board 3 conveyed by the board conveying portion 23. The printing operation portion 24 mainly includes the screen mask (not shown) performing mask-printing, a solder-supply portion (not shown), and the squeegee device (not shown).

The printing operation portion 25 is arranged adjacent to the Y2 side of the printing operation portion 24. The printing operation portion 25 is similar in structure to the printing operation portion 24, and hence the description is omitted.

The operation of the buffer conveyor 1 at the time of the setup for the board conveying portion 12 is now described with reference to FIG. 8.

Figure 8:
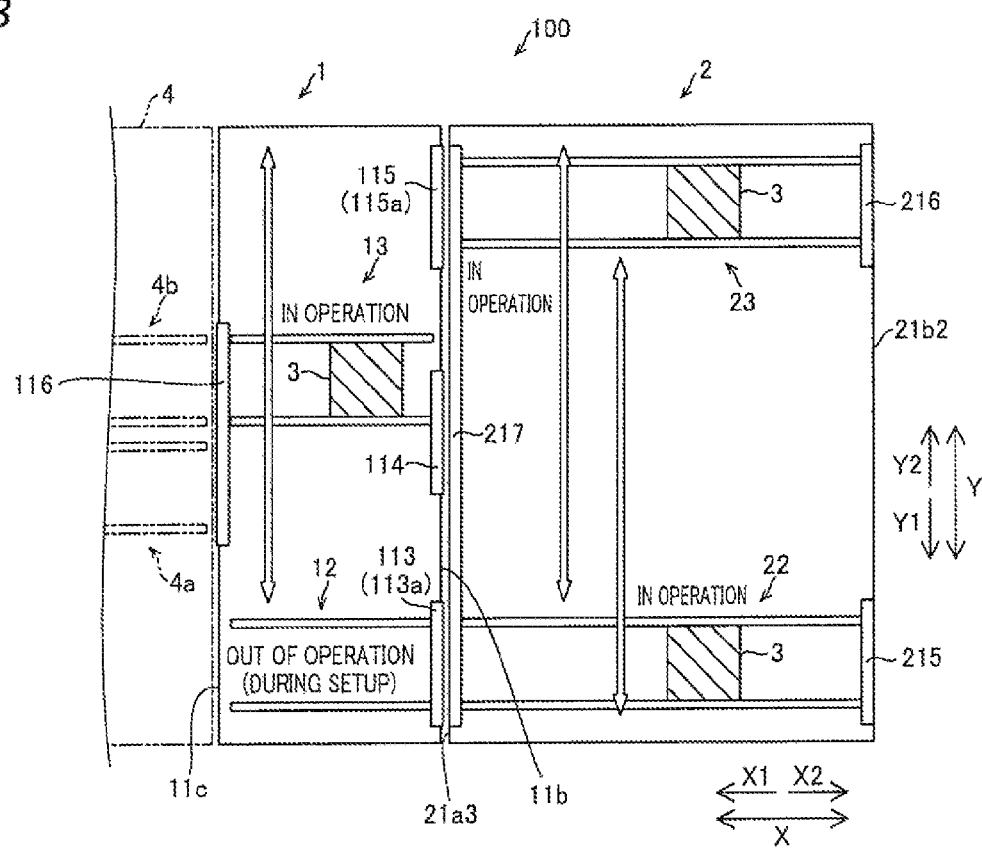
FIG. 8 is a plan view for illustrating the case where setup for the board conveying portion of the buffer conveyor of the board working system according to the embodiment of the present disclosure is performed.

As shown in FIG. 8, when the setup for the board conveying portion 12 of the buffer conveyor 1 is performed while the board conveying portion 13 of the buffer conveyor 1 and the board conveying portions 22 and 23 of the printing machine 2 operate, for example, a user opens the opening and closing door 111 (see FIG. 2). At this time, the board conveying portion 12 is arranged on the Y1 side, and driving of the motor 17a is turned off and stopped. In addition, the shutter device 113a is closed.

The board conveying portion 13 of the buffer conveyor 1 in operation is operable to move in the direction Y without interfering with the board conveying portion 12. In other words, the board conveying portion 13 is operative to receive the board 3 on which printing has been completed in the printing operation portion 24 from the board conveying portion 22 moved to a central portion of the printing machine 2 in the direction Y through the carry-in port 114, deliver the board 3 to the front lane 4a or the rear lane 4b of the apparatus 4 through the carry-out port 116, receive the board 3 on which printing has been completed in the printing operation portion 25 from the board conveying portion 23 located in an end of the printing machine 2 on the Y2 side through the carry-in port 115, and deliver the board 3 to the front lane 4a or the rear lane 4b of the apparatus 4 through the carry-out port 116. At this time, the shutter device 115a is opened. Thus, the setup for the board conveying portion 12 can be performed without stopping the printing machine 2 on the upstream side and the apparatus 4 on the downstream side.

The same holds for the case where the user opens the opening and closing door 112 (see FIG. 2) and sets up the board conveying portion 13 of the buffer conveyor 1. The board conveying portion 13 is arranged on the Y2 side, and driving of the motor 17b is turned off and stopped. In addition, the shutter device 115a is closed. The board 3 on which printing has been completed in the printing operation portion 25 is delivered from the board conveying portion 23 moved to the central portion of the printing machine 2 in the direction Y to the board conveying portion 12 through the carry-in port 114 and thereafter is delivered to the front lane 4a or the rear lane 4b of the apparatus 4 through the carry-out port 116. The board 3 on which printing has been completed in the printing operation portion 24 is delivered from the board conveying portion 22 located in an end of the printing machine 2 on the Y1 side to the board conveying portion 12 through the carry-in port 113 and thereafter is delivered to the front lane 4a or the rear lane 4b of the apparatus 4 through the carry-out port 116. At this time, the shutter device 113a is opened. Thus, the setup for the board conveying portion 13 can be performed without stopping the printing machine 2 on the upstream side and the apparatus 4 on the downstream side.

Interlock control processing performed by the overall interlock circuit 15 of the board working system 100 according to the embodiment of the present disclosure is now described with reference to FIG. 9. This control processing is continuously performed during the operation of the buffer conveyor 1.

Figure 9:
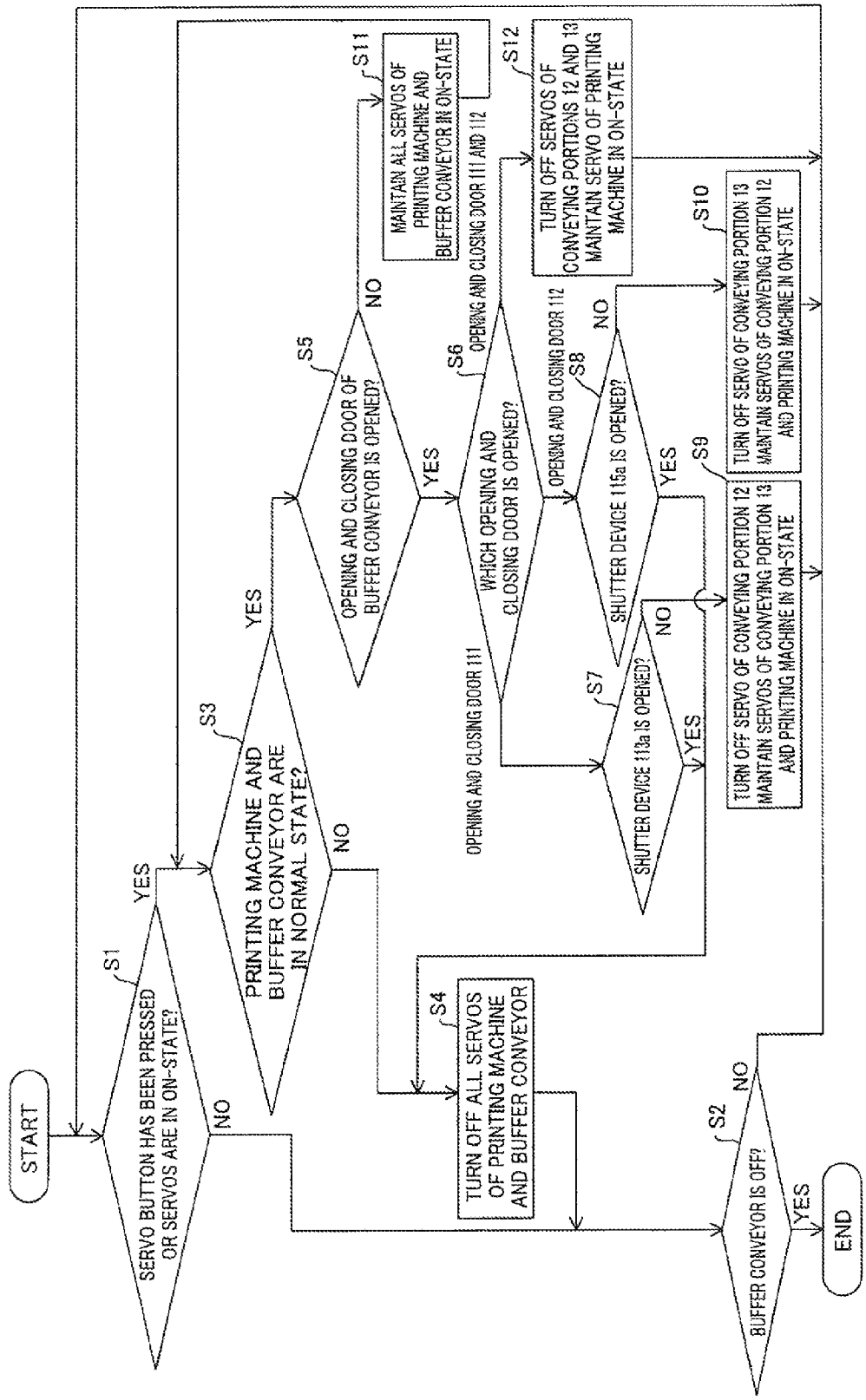
FIG. 9 is a flowchart for illustrating interlock control processing performed by an overall interlock circuit of the board working system according to the embodiment of the present disclosure.

At a step S1 shown in FIG. 9, the overall interlock circuit 15 determines whether or not a servo button (not shown) has been pressed or whether or not the servos are in an on-state. In other words, the overall interlock circuit 15 determines whether or not the servo button has been pressed, power is supplied to the board conveying portions 12 and 13 of the buffer conveyor 1, and the board conveying portions 12 and 13 are in an operational state. The overall interlock circuit 15 advances to a step S3 when determining that the servo button has been pressed or the servos are in the on-state, and the overall interlock circuit 15 advances to a step S2 when determining that the servo button has not been pressed or the servos are in an off-state. At the step S2, the overall interlock circuit 15 determines whether or not the buffer conveyor 1 is off. When determining that the buffer conveyor 1 is off, the overall interlock circuit 15 terminates the interlock control processing. When determining that the buffer conveyor 1 is on, the overall interlock circuit 15 returns to the step S1.

When determining that the servo button has been pressed or the servos are in the on-state at the step S1, the overall interlock circuit 15 determines whether or not the printing machine 2 and the buffer conveyor 1 are in a normal state at the step S3. In the normal state, there is no anomaly in the printing machine 2 and the buffer conveyor 1, and the printing machine 2 and the buffer conveyor 1 are in an operable state. In a non-normal state, the user presses an emergency stop button (not shown), or there are anomalies in the printing machine 2 or the buffer conveyor 1. The overall interlock circuit 15 advances to a step S5 when determining that the printing machine 2 and the buffer conveyor 1 are in the normal state and advances to a step S4 when determining that the printing machine 2 and the buffer conveyor 1 are not in the normal state.

When the printing operation is normally performed and the boards are normally conveyed, the opening and closing doors 111 and 112 are closed and the shutter devices 113a and 115a remain open. When an operator opens the opening and closing door 111 or 112 for maintenance, an unshown control portion performs control of closing the shutter device 113a or 115a on the same side as the opened opening and closing door in the direction Y. Thus, the printing operation and the board conveying operation can be changed to corresponding states. The non-normal state at the step S3 denotes a state where anomalies occur in each device or each apparatus constituting the printing machine 2 or the buffer conveyor 1, the original operation becomes impossible, and normal printing and conveyance cannot be performed. If the opening and closing doors 111 and 112 and the shutter devices 113a and 115a can be opened and closed, the overall interlock circuit 15 determines that the printing machine 2 and the buffer conveyor 1 are in the normal state at the step S3 regardless of the opening/closing states.

At the step S4, all the servos of the printing machine 2 and the buffer conveyor 1 are turned off, and the operation of the printing machine 2 and the buffer conveyor 1 is stopped. Thereafter, the overall interlock circuit 15 advances to the step S2. When determining that the printing machine 2 and the buffer conveyor 1 are in the normal state at the step S3, the overall interlock circuit 15 determines whether or not any opening and closing door of the buffer conveyor 1 is opened at the step S5. In other words, the overall interlock circuit 15 determines whether or not the opening and closing door is opened in order to perform the setup for the board conveying portion of the buffer conveyor 1. The overall interlock circuit 15 advances to a step S11 when both the opening and closing doors 111 and 112 are closed and advances to a step S6 when at least one of the opening and closing doors 111 and 112 is opened.

At the step S6, the overall interlock circuit 15 determines which opening and closing door is opened. The overall interlock circuit 15 advances to a step S7 when only the opening and closing door 111 (see FIG. 2) is opened and advances to a step S8 when only the opening and closing door 112 (see FIG. 2) is opened. When both the opening and closing doors 111 and 112 are opened, the overall interlock circuit 15 advances to a step S12. At the step S7, the overall interlock circuit 15 determines whether or not the shutter device 113a (see FIG. 2) is opened. In other words, the overall interlock circuit 15 determines whether or not the shutter device 113a of the buffer conveyor 1 on the Y1 side is opened in the state where the opening and closing door 111 of the buffer conveyor 1 on the Y1 side is opened. When the shutter device 113a is opened, the overall interlock circuit 15 determines that there are anomalies in the opening and closing door 111 or the shutter device 113a, advances to the step S4, and turns off all the servos of the printing machine 2 and the buffer conveyor 1 to stop the operation. When the shutter device 113a is closed, the overall interlock circuit 15 advances to a step S9 as processing at the time of the normal setup.

At the step S9, the servo of the board conveying portion 12 of the buffer conveyor 1 is turned off, and the servos of the board conveying portion 13 of the buffer conveyor 1 and the printing machine 2 are maintained in the on-state. In other words, the operation of the board conveying portion 12 to be set up is stopped, and the operation of the board conveying portion 13 and the printing machine 2 continues. Thereafter, the overall interlock circuit 15 returns to the step S1.

When determining that only the opening and closing door 112 is opened at the step S6, the overall interlock circuit 15 determines whether or not the shutter device 115a (see FIG. 2) is opened at the step S8. In other words, the overall interlock circuit 15 determines whether or not the shutter device 115a of the buffer conveyor 1 on the Y2 side is opened in the state where the opening and closing door 112 of the buffer conveyor 1 on the Y2 side is opened. When the shutter device 115a is opened, the overall interlock circuit 15 determines that there are anomalies in the opening and closing door 112 or the shutter device 115a, advances to the step S4, and turns off all the servos of the printing machine 2 and the buffer conveyor 1 to stop the operation. When the shutter device 115a is closed, the overall interlock circuit 15 advances to a step S10 as processing at the time of the normal setup.

At the step S10, the servo of the board conveying portion 13 of the buffer conveyor 1 is turned off, and the servos of the board conveying portion 12 of the buffer conveyor 1 and the printing machine 2 are maintained in the on-state. In other words, the operation of the board conveying portion 13 to be set up is stopped, and the operation of the board conveying portion 12 and the printing machine 2 continues. Thereafter, the overall interlock circuit 15 returns to the step S1.

When determining that both the opening and closing doors 111 and 112 are opened at the step S6, the overall interlock circuit 15 turns off the servos of the board conveying portions 12 and 13 of the buffer conveyor 1 and maintains the servo of the printing machine 2 in the on-state at the step S12. In other words, the operation of the board conveying portions 12 and 13 is stopped, and the operation of the printing machine 2 continues.

When determining that both the opening and closing doors 111 and 112 are closed at the step S5, the overall interlock circuit 15 maintains all the servos of the printing machine 2 and the buffer conveyor 1 in the on-state at the step S11. In other words, the operation of the printing machine 2 and the buffer conveyor 1 continues. Thereafter, the overall interlock circuit 15 returns to the step S3.

According to this embodiment, as hereinabove described, the buffer conveyor 1 is provided with the shutter device 113a closing such that there is no opening gap leading from the board conveying portion 12 of the buffer conveyor 1 to the printing machine 2 (the opening gap is 0 mm) when the setup for the board conveying portion 12 is performed, whereby the shutter device 113a can prevent the entry of extraneous material into the printing machine 2 from the board conveying portion 12 of the buffer conveyor 1 through an opening when the setup for the board conveying portion 12 of the buffer conveyor 1 is performed. Thus, the operation of the printing machine 2 may not be stopped when the setup for the board conveying portion 12 of the buffer conveyor 1 is performed, and hence a reduction in the efficiency of work on the board 3 such as mask-printing can be suppressed.

According to this embodiment, the buffer conveyor 1 is provided with the shutter switch 113b (115b) detecting opening/closing of the shutter device 113a (115a). Thus, closing of the shutter device 113a (115a) can be reliably detected by the shutter switch 113b (115b) when the setup for the board conveying portion 12 (13) of the buffer conveyor 1 is performed.

According to this embodiment, as hereinabove described, the overall interlock circuit 15 controlling the printing machine 2 and the buffer conveyor 1 is configured to perform control of stopping at least one of the printing machine 2 and the buffer conveyor 1 when the shutter device 113a or 115a is opened in the state where the opening and closing door 111 or 112 is opened. Thus, at least one of the printing machine 2 and the buffer conveyor 1 is stopped in the case where there are operational anomalies in the shutter device 113a or 115a, and hence damage of the printing machine 2 or the buffer conveyor 1 can be suppressed even in the case where an extraneous material enters one of the buffer conveyor 1 and the printing machine 2 from the other of the buffer conveyor 1 and the printing machine 2 through the opening. The case where there are operational anomalies in the shutter device 113a or 115a denotes the case where the shutter device 113a or 115a remains open or the once closed shutter device 113a or 115a is reopened in the state where the opening and closing door 111 or 112 is opened despite the fact that the unshown control portion performs control of closing the shutter device 113a or 115a on the same side as the opened opening and closing door in the direction Y when the operator opens the opening and closing door 111 or 112 for maintenance.

According to this embodiment, the buffer conveyor 1 is provided with the door switch 111a (112a) detecting opening/closing of the opening and closing door 111 (112). Thus, opening of the opening and closing door 111 (112) can be reliably detected when the opening and closing door 111 (112) is opened in the state where the shutter device 113a (115a) remains open, and hence at least one of the printing machine 2 and the buffer conveyor 1 can be reliably stopped.

According to this embodiment, the overall interlock circuit 15 is configured to perform control of stopping at least one of the printing machine 2 and the buffer conveyor 1 by controlling power supplied to the printing machine 2 and the buffer conveyor 1 when the shutter device 113a (115a) is opened in the state where the opening and closing door 111 (112) is opened. Thus, power supplied to at least one of the printing machine 2 and the buffer conveyor 1 is stopped when the shutter device 113a (115a) is opened in the state where the opening and closing door 111 (112) is opened, and hence the operation of the printing machine 2 or the buffer conveyor 1 can be reliably stopped.

According to this embodiment, as hereinabove described, the buffer conveyor 1 is configured such that the maximum interval D of the opening gap leading from the board conveying portion 12 to the board conveying portion 13 is not more than the prescribed value (6 mm, for example) when the setup for the board conveying portion 12 is performed. Thus, the entry of extraneous material into the board conveying portion 13 from the board conveying portion 12 can be prevented when the setup for the board conveying portion 12 is performed, and hence the operation of the board conveying portion 13 may not be stopped. Consequently, a reduction in the efficiency of conveyance work of the board 3 performed by the board conveying portion 13 can be suppressed.

According to this embodiment, the back cover 122 is provided on the side of the board conveying portion 12 closer to the board conveying portion 13 in the buffer conveyor 1 such that the maximum interval D of the opening gap leading from the board conveying portion 12 to the board conveying portion 13 is not more than the prescribed value (6 mm, for example). Thus, the maximum interval D of the opening gap leading from the board conveying portion 12 to the board conveying portion 13 can be easily set to not more than the prescribed value (6 mm, for example) with the back cover 122.

According to this embodiment, as hereinabove described, the board conveying portion 22 of the printing machine 2 is configured to deliver the board 3 to the board conveying portion 12 of the buffer conveyor 1 through the shutter device 113a and deliver the board 3 to the board conveying portion 13 of the buffer conveyor 1 through the carry-in port 114, and the shutter device 113a is configured to close such that there is no opening gap leading from the board conveying portion 12 to the board conveying portion 22 of the printing machine 2 when the setup for the board conveying portion 12 of the buffer conveyor 1 is performed. Thus, the board conveying portion 22 of the printing machine 2 can deliver the board 3 to the board conveying portion 13 of the buffer conveyor 1 even when the shutter device 113a is closed, and hence the board conveying portions 22 and 23 can continuously operate while the entry of extraneous material into the board conveying portion 22 from the board conveying portion 12 is prevented even during the setup for the board conveying portion 12 of the buffer conveyor 1. Consequently, a reduction in the efficiency of work on the board 3 can be effectively suppressed.

According to this embodiment, as hereinabove described, the board conveying portion 13 of the buffer conveyor 1 is configured to receive the board 3 from the board conveying portion 23 of the printing machine 2 through a site different from the shutter device 113a, and the shutter device 113a is configured to close such that there is no opening gap leading from the board conveying portion 12 to the board conveying portion 22 of the printing machine 2 (the opening gap is 0 mm) when the setup for the board conveying portion 12 is performed. Thus, the board conveying portion 13 can receive the board 3 from the board conveying portion 23 of the printing machine 2 through the site different from the shutter device 113a when the setup for the board conveying portion 12 is performed, and hence a reduction in the efficiency of work on the board 3 can be easily suppressed.

According to this embodiment, as hereinabove described, the board conveying portion 13 is configured to receive the board 3 from the board conveying portion 22 in addition to the board conveying portion 23 of the printing machine 2 through a site different from the shutter device 113a when the setup for the board conveying portion 12 is performed. Thus, the board conveying portion 13 can receive the boards 3 from both the board conveying portion 22 and the board conveying portion 23 through the sites different from the shutter device 113a when the setup for the board conveying portion 12 is performed, and hence a reduction in the efficiency of work on the board 3 can be more easily suppressed.

The embodiment disclosed this time must be considered as illustrative in all points and not restrictive. The range of the present disclosure is shown not by the above description of the embodiment but by the scope of claims for patent, and all modifications within the meaning and range equivalent to the scope of claims for patent are further included.

For example, while the printing machine performing a solder printing operation on the board is employed as the example of the board working apparatus according to the present disclosure in the aforementioned embodiment, the present disclosure is not restricted to this. A surface mounter performing a component mounting operation on the board or an inspection apparatus performing an inspection operation on a component on the board may alternatively be employed as the board working apparatus according to the present disclosure, for example.

Figure 10:
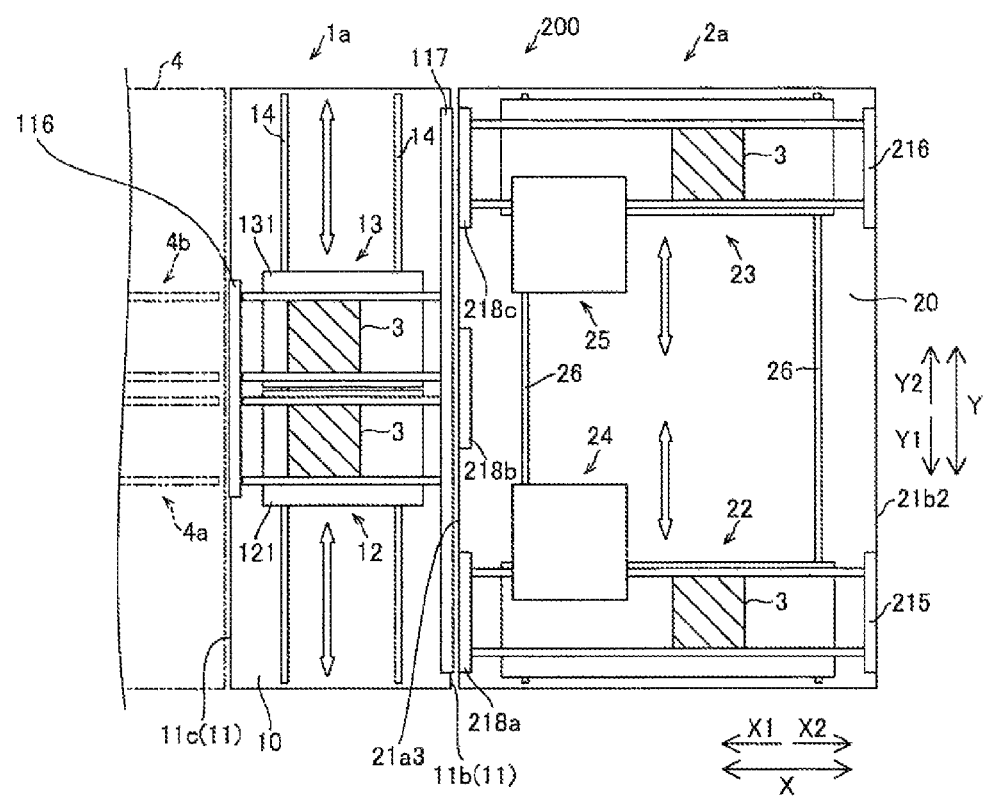
FIG. 10 is a plan view showing a board conveying portion of a buffer conveyor and a board conveying portion of a printing machine of a board working system according to a modification of the embodiment of the present disclosure.

While the shutter device is provided in the buffer conveyor as the board conveying apparatus in the aforementioned embodiment, the present disclosure is not restricted to this. According to the present disclosure, the shutter device closing such that the maximum interval of the opening gap leading from the first board conveying portion to the board working apparatus is not more than a prescribed value may alternatively be provided in the board working apparatus (printing machine 2a) when the setup for the first board conveying portion (board conveying portion 12) of the board conveying apparatus (buffer conveyor 1a) is performed, as in a board working system 200 according to a modification shown in FIG. 10. In this case, a carry-out port 218a including the shutter device having the shutter opening/closing detection portion detecting opening/closing of the shutter device may be arranged on the Y1 side of the side cover 21a2 on the X2 side constituting the downstream cover member 21a, and a carry-out port 218c including the shutter device having the shutter opening/closing detection portion detecting opening/closing of the shutter device may be arranged on the Y2 side of the side cover 21a2. Furthermore, a carry-out port 218b may be arranged between the carry-out ports 218a and 218c, i.e. in a central portion of the side cover 21a2 in the direction Y. In addition, a single carry-in port 117 extending from the Y1 side to the Y2 side may be provided in the side cover 11b on the X2 side of the cover member 11 of the buffer conveyor 1a to be opposed to the carry-out ports 218a to 218c.

Alternatively, the shutter device closing such that the maximum interval of the opening gap leading from the first board conveying portion to the board working apparatus is not more than the prescribed value when the setup for the first board conveying portion of the board conveying apparatus is performed may be provided in each of the board working apparatus and the board conveying apparatus.

While the shutter device is configured to close such that there is no opening gap leading from the first board conveying portion to the board working apparatus (the opening gap is 0 mm) when the setup for the first board conveying portion of the board conveying apparatus is performed in the aforementioned embodiment, the present disclosure is not restricted to this. According to the present disclosure, the shutter device may alternatively be configured to close such that the opening gap leading from the first board conveying portion to the board working apparatus is not more than a prescribed value (6 mm, for example) when the setup for the first board conveying portion of the board conveying apparatus is performed.

While the printing machine as the board working apparatus includes the third board conveying portion (board conveying portion 22) and the fourth board conveying portion (board conveying portion 23) in the aforementioned embodiment, the present disclosure is not restricted to this. According to the present disclosure, the board working apparatus may alternatively include a single board conveying portion. In this case, the single board conveying portion of the board working apparatus may distribute and deliver the boards to the plurality of board conveying portions of the board conveying apparatus.

While the printing machine as the board working apparatus is arranged on the upstream side of the buffer conveyor as the board conveying apparatus in the conveyance direction and delivers the boards to the board conveying apparatus in the aforementioned embodiment, the present disclosure is not restricted to this. According to the present disclosure, the board conveying apparatus may alternatively be arranged on the upstream side of the board working apparatus in the conveyance direction and deliver the boards to the board working apparatus.

While both the board working apparatus (printing machine) and the board conveying apparatus (buffer conveyor) are stopped when the shutter device is opened in the state where the opening and closing door is opened in the aforementioned embodiment, the present disclosure is not restricted to this. According to the present disclosure, at least one of the board working apparatus and the board conveying apparatus may alternatively be stopped when the shutter device is opened in the state where the opening and closing door is opened.

While the overall interlock circuit as the controller is provided in the buffer conveyor as the board conveying apparatus in the aforementioned embodiment, the present disclosure is not restricted to this. According to the present disclosure, the controller may alternatively be provided in the board working apparatus or in an external apparatus other than the board conveying apparatus and the board working apparatus.

While the processing performed by the overall interlock circuit as the controller according to the present disclosure is described, using the flowchart described in a flow-driven manner in which processing is performed in order along a processing flow for the convenience of illustration in the aforementioned embodiment, the present disclosure is not restricted to this. According to the present disclosure, the processing performed by the controller may alternatively be performed in an event-driven manner in which processing is performed on an event basis. In this case, the processing performed by the controller may be performed in a complete event-driven manner or in a combination of an event-driven manner and a flow-driven manner.

What is claimed is:

1. A board working system comprising:
   a board working apparatus working on a board;
   a board conveying apparatus including a first board conveying portion conveying the board in a prescribed direction, a second board conveying portion arranged adjacent to the first board conveying portion in a direction orthogonal to the prescribed direction, and a cover member covering the first board conveying portion and the second board conveying portion, the board conveying apparatus being connected to the board working apparatus, and
   at least one of the board working apparatus and the board conveying apparatus being provided with a shutter device closing such that a maximum interval of an opening gap leading from the first board conveying portion to the board working apparatus is not more than a prescribed value when setup for the first board conveying portion is performed.

2. The board working system according to claim 1, wherein the shutter device is provided in the board conveying apparatus and is configured to close such that the maximum interval of the opening gap leading from the first board conveying portion to the board working apparatus is not more than the prescribed value when the setup for the first board conveying portion is performed.

3. The board working system according to claim 1, wherein the board working apparatus or the board conveying apparatus provided with the shutter device further includes a shutter opening/closing detection portion, said shutter opening/closing detection portion detecting opening/closing of the shutter device.

4. The board working system according to claim 1, further comprising a controller controlling the board working apparatus and the board conveying apparatus, wherein
   the cover member of the board conveying apparatus includes an opening and closing door opened when the setup for the first board conveying portion is performed, and
   the controller is configured to perform control of stopping at least one of the board working apparatus and the board conveying apparatus when the shutter device is opened in a state where the opening and closing door is opened.

5. The board working system according to claim 4, wherein the board conveying apparatus further includes a door opening/closing detection portion detecting opening/closing of the opening and closing door.

6. The board working system according to claim 4, wherein the controller is configured to perform control of stopping at least one of the board working apparatus and the board conveying apparatus by controlling power supplied to the board working apparatus and the board conveying apparatus when the shutter device is opened in the state where the opening and closing door is opened.

7. The board working system according to claim 1, wherein the board working apparatus includes a third board conveying portion conveying the board in the prescribed direction and a fourth board conveying portion arranged adjacent to the third board conveying portion in the direction orthogonal to the prescribed direction,
   the third board conveying portion is configured to deliver the board to the first board conveying portion through the shutter device and deliver the board to the second board conveying portion through a site different from the shutter device, and
   the shutter device is configured to close such that a maximum interval of an opening gap leading from the first board conveying portion to the third board conveying portion of the board working apparatus is not more than the prescribed value when the setup for the first board conveying portion is performed.

8. The board working system according to claim 7, wherein the second board conveying portion is configured to receive the board from each of the third board conveying portion and the fourth board conveying portion through a site different from the shutter device when the setup for the first board conveying portion is performed.

9. The board working system according to claim 1, wherein the board conveying apparatus is configured such that the maximum interval of the opening gap leading from the first board conveying portion to the second board conveying portion is not more than the prescribed value when the setup for the first board conveying portion is performed.

10. The board working system according to claim 9, wherein
    the board conveying apparatus further includes a partition member provided on a side of the first board conveying portion closer to the second board conveying portion such that the maximum interval of the opening gap leading from the first board conveying portion to the second board conveying portion is not more than the prescribed value.

11. A board conveying apparatus connected to a board working apparatus working on a board, comprising:
    a first board conveying portion conveying the board in a prescribed direction;
    a second board conveying portion arranged adjacent to the first board conveying portion in a direction orthogonal to the prescribed direction;
    a cover member covering the first board conveying portion and the second board conveying portion; and
    a shutter device closing such that a maximum interval of an opening gap leading from the first board conveying portion to the board working apparatus is not more than a prescribed value when setup for the first board conveying portion is performed.

12. The board conveying apparatus according to claim 11, wherein
    the board working apparatus includes a third board conveying portion conveying the board in the prescribed direction and a fourth board conveying portion arranged adjacent to the third board conveying portion in the direction orthogonal to the prescribed direction,
    the second board conveying portion is configured to receive the board from the fourth board conveying portion through a site different from the shutter device, and
    the shutter device is configured to close such that the maximum interval of the opening gap leading from the first board conveying portion to the third board conveying portion of the board working apparatus is not more than the prescribed value when the setup for the first board conveying portion is performed.

13. The board conveying apparatus according to claim 12, wherein
    the second board conveying portion is configured to receive the board from the third board conveying portion in addition to the fourth board conveying portion through a site different from the shutter device when the setup for the first board conveying portion is performed.

14. The board conveying apparatus according to claim 11, configured such that a maximum interval of an opening gap leading from the first board conveying portion to the second board conveying portion is not more than a prescribed value when the setup for the first board conveying portion is performed.

15. A board working apparatus working on a board, comprising:
   a board working portion connected to a board conveying apparatus including a first board conveying portion conveying the board in a prescribed direction, a second board conveying portion arranged adjacent to the first board conveying portion in a direction orthogonal to the prescribed direction, and a cover member covering the first board conveying portion and the second board conveying portion; and
   a shutter device closing such that a maximum interval of an opening gap leading from the first board conveying portion of the board conveying apparatus to the board working portion is not more than a prescribed value when setup for the first board conveying portion is performed.

* * * * *